(12) United States Patent
Wu et al.

(10) Patent No.: US 9,094,039 B2
(45) Date of Patent: Jul. 28, 2015

(54) EFFICIENT DEFLATE DECOMPRESSION

(71) Applicant: Advanced Micro Devices, Inc., Sunnyvale, CA (US)

(72) Inventors: Winthrop J Wu, Shrewsbury, MA (US); Martin Kiernicki, Acton, MA (US); Creighton Eldridge, Cambridge, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/057,553

(22) Filed: Oct. 18, 2013

(65) Prior Publication Data
US 2015/0109153 A1 Apr. 23, 2015

(51) Int. Cl.
*H03M 7/40* (2006.01)
*H03M 7/30* (2006.01)

(52) U.S. Cl.
CPC *H03M 7/30* (2013.01); *H03M 7/40* (2013.01); *H03M 7/4031* (2013.01)

(58) Field of Classification Search
CPC ........ H03M 7/30; H03M 7/40; H03M 7/4031
USPC .................................. 341/65, 67, 106, 95, 63
See application file for complete search history.

(56) References Cited

U.S. PATENT DOCUMENTS

| | | | |
|---|---|---|---|
| 6,411,229 B2 * | 6/2002 | Kobayashi | 341/67 |
| 8,429,510 B2 * | 4/2013 | Kalfon et al. | 714/781 |
| 8,775,750 B2 * | 7/2014 | Chong et al. | 711/157 |
| 8,886,848 B2 * | 11/2014 | Peuser et al. | 710/9 |

OTHER PUBLICATIONS

Deutsch, J. Gailly L., and Jean-Loup Gailly. "RFC 1950—ZLIB Compressed Data Format Specification version 3.3." IETF/IESG, May (1996).
Deutsch, L. Peter. "DEFLATE compressed data format specification version 1.3." (1996).

* cited by examiner

*Primary Examiner* — Brian Young
(74) *Attorney, Agent, or Firm* — Liang & Cheng, PC

(57) ABSTRACT

A decompression engine may include an input configured to receive an input code comprises one or more bits from a bitstream of encoded data, a symbol decoder coupled with the input, where the symbol decoder is configured to calculate, based on the input code, a plurality of candidate addresses each corresponding to a code group. The symbol decoder may further include a group identifier module coupled with the symbol decoder, wherein the group identifier module is configured to identify one of the plurality of code groups corresponding to the input code, and a multiplexer coupled with the group identifier module, wherein the multiplexer is configured to select as a final address one of the plurality of candidate addresses corresponding to the identified code group.

20 Claims, 8 Drawing Sheets

| Run Length | | Comment | Group Encodings | | | | | | | | | | | | |
|---|---|---|---|---|---|---|---|---|---|---|---|---|---|---|
| length | code | | 306(1) 1-bit | Cnt | 306(2) 2-bit | Cnt | 306(3) 3-bit | Cnt | 306(4) 4-bit | Cnt | 306(5) 5-bit | Cnt | 306(6) 6-bit | Cnt | 306(7) 7-bit | Cnt |
| 16 | 3'b110 | 6-bit code | 0 | 0 | 00 | 0 | 000 | 0 | 0000 | 0 | 00000 | 0 | 000000 | 1 | 0000010 | 0 |
| 17 | 3'b100 | 4-bit code | 0 | 0 | 00 | 0 | 000 | 0 | 0000 | 1 | 00010 | 0 | 000100 | 1 | 0001010 | 0 |
| 18 | 3'b101 | 5-bit code | 0 | 0 | 00 | 0 | 000 | 0 | 0000 | 1 | 00010 | 1 | 000110 | 1 | 0001110 | 0 |
| 0 | 3'b010 | 2-bit code | 0 | 0 | 00 | 1 | 010 | 0 | 0100 | 1 | 01010 | 1 | 010110 | 1 | 0101110 | 0 |
| 8 | 3'b000 | Not used | 0 | 0 | 00 | 1 | 010 | 0 | 0100 | 1 | 01010 | 1 | 010110 | 1 | 0101110 | 0 |
| 7 | 3'b010 | 2-bit code | 0 | 0 | 00 | 2 | 100 | 0 | 1000 | 1 | 10010 | 1 | 100110 | 1 | 1001110 | 0 |
| 9 | 3'b000 | Not used | 0 | 0 | 00 | 2 | 100 | 0 | 1000 | 1 | 10010 | 1 | 100110 | 1 | 1001110 | 0 |
| 6 | 3'b100 | 4-bit code | 0 | 0 | 00 | 2 | 100 | 0 | 1000 | 2 | 10100 | 1 | 101010 | 1 | 1010110 | 0 |
| 10 | 3'b000 | Not used | 0 | 0 | 00 | 3 | 110 | 0 | 1100 | 2 | 10100 | 1 | 101010 | 1 | 1010110 | 0 |
| 5 | 3'b010 | 2-bit code | 0 | 0 | 00 | 3 | 110 | 0 | 1100 | 2 | 11000 | 1 | 111010 | 1 | 1110110 | 0 |
| 11 | 3'b000 | Not used | 0 | 0 | 00 | 3 | 110 | 0 | 1100 | 2 | 11100 | 2 | 111100 | 1 | 1110110 | 0 |
| 4 | 3'b101 | 5-bit code | 0 | 0 | 00 | 3 | 110 | 0 | 1100 | 2 | 11100 | 2 | 111100 | 1 | 1111010 | 0 |
| 12 | 3'b000 | Not used | 0 | 0 | 00 | 3 | 110 | 0 | 1100 | 2 | 11100 | 2 | 111100 | 1 | 1111010 | 0 |
| 3 | 3'b000 | Not used | 0 | 0 | 00 | 3 | 110 | 0 | 1100 | 2 | 11100 | 2 | 111100 | 1 | 1111010 | 0 |
| 13 | 3'b000 | Not used | 0 | 0 | 00 | 3 | 110 | 0 | 1100 | 2 | 11100 | 2 | 111100 | 1 | 1111010 | 0 |
| 2 | 3'b101 | 5-bit code | 0 | 0 | 00 | 3 | 110 | 0 | 1100 | 2 | 11100 | 3 | 111110 | 1 | 1111110 | 0 |
| 14 | 3'b000 | Not used | 0 | 0 | 00 | 3 | 110 | 0 | 1100 | 2 | 11100 | 3 | 111110 | 1 | 1111110 | 0 |
| 1 | 3'b110 | 6-bit code | 0 | 0 | 00 | 3 | 110 | 0 | 1100 | 2 | 11100 | 3 | 111110 | 2 | 0000000 | 0 |
| 15 | 3'b000 | Not used | 0 | 0 | 00 | 3 | 110 | 0 | 1100 | 2 | 11100 | 3 | 111110 | 2 | 0000000 | 0 |

FIGURE 3B

| | Group 1 | | Group 2 | | Group 3 | | Group 4 | |
|---|---|---|---|---|---|---|---|---|
| Symbol Length | Code$_1$ 406(1) | start addx | Code$_2$ 406(2) | start addx | Code$_3$ 406(3) | start addx | Code$_4$ 406(4) | start addx |
| initial | | | | | | | | |
| A 3 | 0 | 0 | 00 | 0 | 000 | 0 | 0000 | 0 |
| B 3 | 0 | 0 | 00 | 0 | 000 | 0 | 0010 | 1 |
| C 3 | 0 | 0 | 00 | 0 | 000 | 0 | 0100 | 2 |
| D 3 | 0 | 0 | 00 | 0 | 000 | 0 | 0110 | 3 |
| E 3 | 0 | 0 | 00 | 0 | 000 | 0 | 1000 | 4 |
| F 2 | 0 | 0 | 00 | 0 | 010 | 1 | 1010 | 5 |
| G 4 | 0 | 0 | 00 | 0 | 010 | 1 | 1110 | 6 |
| H 4 | 0 | 0 | 00 | 0 | 010 | 1 | 1110 | 6 |

FIGURE 4B

Huffman code table 412

| ADDX | SYMBOL |
|---|---|
| 0 | F |
| 1 | A |
| 2 | B |
| 3 | C |
| 4 | D |
| 5 | E |
| 6 | G |
| 7 | H | start code/pointer table 413

| GROUP | START CODE | POINTER |
|---|---|---|
| 1 | 0 | 0 |
| 2 | 00 | 0 |
| 3 | 010 | 1 |
| 4 | 1110 | 6 |

FIGURE 4C

EFFICIENT DEFLATE DECOMPRESSION

TECHNICAL FIELD

This disclosure relates to the field of data compression and, in particular, to a decompression engine.

BACKGROUND

Modern computing applications frequently benefit from the use of lossless data compression, which is a class of data compression wherein the exact original data is restored from the compressed form of the data without any loss of information. Lossless data compression may be used, for example, to compress databases files, documents, executable files, or other types of files where even minor differences between the original data and the decompressed data may not be tolerated.

One technique for performing lossless data compression is known as Huffman encoding, a process wherein symbols are encoded into variable length bit strings based on the actual or estimated frequency of occurrence of those symbols in the original data. Each symbol in a Huffman encoding scheme may represent, for example, a single character. The more frequently occurring symbols are assigned to shorter bit strings, while less frequently occurring symbols are assigned to longer bit strings. Huffman encoding uses "prefix-free codes", where the bit string for any given symbol is never a prefix for the bit string of any other symbol.

In order for a computer system to decode a set of Huffman encoded data, the computer system may construct a tree structure, then use the sequence of bits of the encoded data to traverse the tree structure in order to correlate each of the prefix-free codes in the encoded data with the appropriate symbol.

Huffman encoding is utilized as part of the Deflate data compression algorithm, which organizes encoded data into a series of blocks. Each of these blocks contains information about the compression method used for the encoded data in the block, and also includes the Huffman trees to be used for decoding the data.

Current implementations for decompressing Deflate encoded data rely on redundant storage in memory with multiple memory access penalties for storing and traversing the Huffman trees. Such implementations are therefore limited in speed of decompression and require a substantial amount of available memory.

BRIEF DESCRIPTION OF THE DRAWINGS

The present disclosure is illustrated by way of example, and not by way of limitation, in the figures of the accompanying drawings.

FIG. 3B is a table illustrating the generation of starting codes for symbols in a code length alphabet, according to one embodiment.

FIG. 4B is a table illustrating the generation of starting codes for symbols in a literal/length alphabet, according to one embodiment.

FIG. 4C illustrates decoding tables, according to one embodiment.

DETAILED DESCRIPTION

Figure 1:
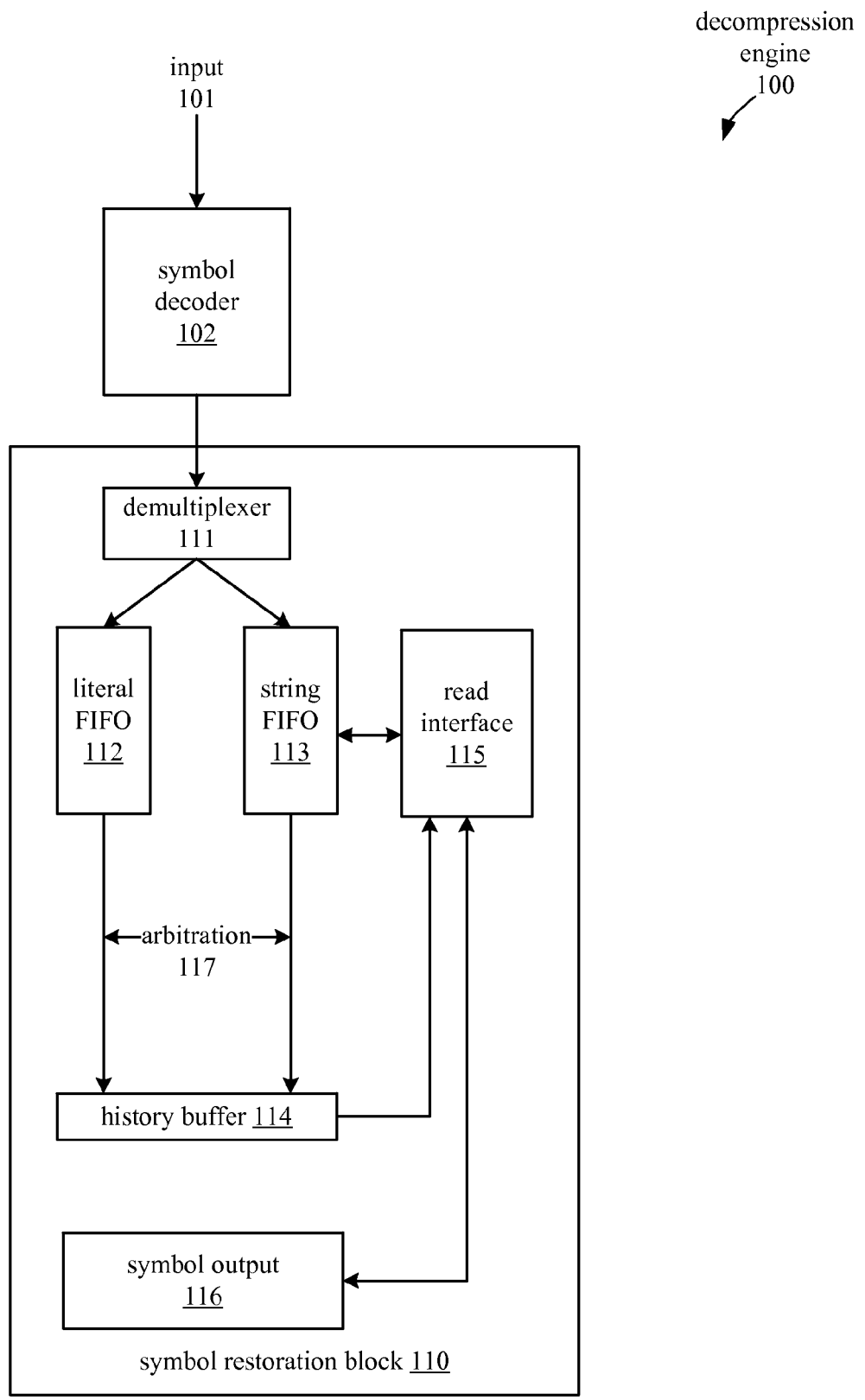
FIG. 1 illustrates an embodiment of a decompression engine.

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the spirit and scope of the embodiments.

One embodiment of a decompression engine may perform decompression of Huffman encoded data by generating a decoding table for decoding the data, instead of a Huffman tree. The use of the decoding table may require less memory and fewer memory accesses than other decoding methods that utilize Huffman tree traversal. The use of a decoding table is also particularly well suited for implementation in a hardware decompression engine, as compared to a Huffman tree decoding method. In particular, hardware components may be used to quickly perform the key operations for decoding the data using the decoding table method. In addition, the decompression engine hardware also performs such key operations in parallel, resulting in a faster decompression rate.

One embodiment of such a decompression engine efficiently decompresses data stored in a series of blocks, such as Deflate (RFC 1951) compressed data. For example, each data block in a Deflate stream is either uncompressed, fixed Huffman encoded, or dynamic Huffman encoded. The decompression engine decodes uncompressed blocks at a rate of at least 1 byte per cycle.

The decompression engine decodes Huffman-encoded blocks by constructing Huffman tables, decoding the encoded data into symbols using the Huffman tables, and reconstructing the original sequence of bytes of the original uncompressed data. The decompression engine can create a static Huffman table in a single cycle, and can create dynamic Huffman tables in O(n) cycles, where n represents the number of elements in the encoded alphabet. One such approach for creating Huffman tables is described in U.S. patent application Ser. No. 13/895,109 filed May 15, 2013, which is incorporated herein by reference in its entirety.

A Zlib compressed file as specified in RFC 1950 (Deutsch, J. Gailly L., and Jean-Loup Gailly. "RFC 1950—ZLIB Compressed Data Format Specification version 3.3." IETF/IESG, May (1996)) consists of a header, Deflate compressed data, and an Adler-32 checksum of the original uncompressed data. The header specifies the compression method for the Deflate compressed data and also include various flags. A series of blocks follows the header and represents the Deflate compressed data, as described in RFC 1951 (Deutsch, L. Peter. "DEFLATE compressed data format specification version 1.3." (1996)).

The process for decompressing a Deflate compressed file includes individually decompressing each compressed block in the file. At the beginning of each block is a 3-bit header. The 3-bit header includes a BFINAL bit and two BTYPE bits. The BFINAL bit indicates whether the block is the final block in the compressed file. The BTYPE bits indicate the compression type, with the bits '00' indicating an uncompressed block, '01' indicating a fixed Huffman encoded block, and '10' indicating a dynamic Huffman encoded block.

An uncompressed block identified by the BTYPE bits '00' includes an additional 2 byte length field that indicates the number of bytes of data in the uncompressed block. A decompression engine processes the uncompressed block by determining the number of bytes to extract based on the 2 byte length field, then extracting the bytes of data accordingly.

The process for decompression of a fixed Huffman encoded block identified by BTYPE bits '01' includes reconstitution of the Huffman codes utilized during the compression process. For fixed Huffman blocks, the Huffman codes are predefined so that the decompression engine can initialize a Huffman code table with minimal computation. For a dynamic Huffman encoded block, the block includes a header that is parsed and processed to create decoding tables for decoding the encoded data. The decoding tables for a block include a Huffman code table and a starting code/pointer table that stores starting codes and starting addresses for each of a set of code groups.

A fixed Huffman compressed block includes a stream of symbols from three distinct alphabets: 256 literal symbols, 29 symbol lengths, and 30 symbol distances. These symbols are encoded using two fixed Huffman code sets as described in the Deflate specification RFC-1951. The decompression engine processes a fixed Huffman encoded block by recreating the Huffman tables for decoding the symbols in the stream, restoring the symbols including literal symbols and length-distance pairs from the bitstream, and converting the length-distance pairs into strings of literal symbols. The resulting output is a stream of decoded literal symbols.

For a dynamic Huffman encoded block identified by BTYPE bits '10', the decompression process also includes reconstitution of the Huffman codes utilized during the compression process. A dynamic Huffman encoded block also includes a stream of symbols from the three alphabets, similar to the fixed Huffman encoded block; however, in contrast with the fixed Huffman encoded block, the Huffman code sets for the dynamic Huffman encoded block are encoded in the bitstream prior to the compressed data. These Huffman code sets are themselves Huffman encoded by another Huffman code set that is also embedded in the bitstream. Thus, all three of the Huffman code sets are embedded in the bitstream.

In addition to BFINAL and BTYPE, a dynamic Huffman encoded block also includes the following fields: HLIT, HDIST, HCLEN, Code lengths for the code length alphabet, code lengths for the literal/length alphabet, and code lengths for the distance alphabet.

The HLIT field has a length of 5 bits and indicates the number of literal and length codes used after subtracting 257. Thus, the number of literal and length codes can be obtained by adding 257 to the number indicated in the HLIT field.

The HDIST field has a length of 5 bits and indicates the number of distance codes after subtracting 1. Thus the number of distance codes can be obtained by adding 1 to the number indicated in the HDIST field.

The HCLEN field has a length of 4 bits and indicates the number of code lengths in the code length alphabet after subtracting 4. Thus, the number of code lengths can be obtained by adding 4 to the number indicated in the HCLEN field.

The next (HCLEN+4)×3 bits indicate the code lengths for the code length alphabet. Each 3 bit segment corresponds to one of the code lengths in the following order: 16, 17, 18, 0, 8, 7, 9, 6, 10, 5, 11, 4, 12, 3, 13, 2, 14, 1, and 15. Thus, the first 3 bits indicate the length for code length 16, the second 3 bits indicate the length for code length 17, and so on. The decompression engine uses these code lengths to construct a Huffman table for decoding code lengths.

The code lengths for the code length alphabet are followed by HLIT+257 code lengths for the literal/length alphabet and HDIST+1 code lengths for the distance alphabet. These sequences of code lengths are Huffman encoded using the above described code length alphabet. This is followed by the payload Huffman encoded data.

FIG. 1 illustrates an embodiment of a decompression engine 100. The decompression engine 100 is capable of decompressing any data that has been compressed according to the Deflate compression method as described above. The decompression engine 100 includes a symbol decoder 102 that receives encoded data from an input 101 of the decompression engine 100. The symbol decoder 102 decodes the received input data into a sequence of symbols, which is transmitted to the symbol restoration block 110. The symbol restoration block 110 then recovers the original data based on the received symbols, which includes literal symbols and may also include string symbols represented as length-distance pairs.

The symbol decoder 102 creates decoding tables for both fixed and dynamic Huffman encoded blocks. For fixed Huffman encoded blocks, the decoding tables are predetermined so that the symbol decoder 102 simply initializes the decoding tables at the start of processing the fixed Huffman block. For a dynamic Huffman encoded block, the symbol decoder 102 first recreates the code length table. The code length table is then used to decode the code lengths and calculate the Huffman codes for each entry in the literal/length and distance Huffman decoding tables. The literal/length decoding tables are used for decoding both literal symbols and string lengths, while the distance decoding tables are used for decoding distances associated with the string lengths.

Once the literal/length decoding tables and distance decoding tables have been created, the decompression engine 100 begins the process of symbol restoration. The decompression engine 100 uses an input code including the leading bits from the input bitstream received at input 101 to address an entry in the literal/length Huffman code table. The table entry identifies the 8-bit symbol to insert into the output stream as well the number of bits in the input code, which is also the number of bits of the input bitstream that are consumed for that symbol. Any bits of the input stream that have yet to be consumed are used in the next cycle to identify the next symbol to insert into the output stream. This process continues until the entire input block has been consumed.

The symbols decoded by the symbol decoder 102 are transmitted to the symbol restoration block 110. The symbol restoration block 110 reconstructs the original data based on the received decoded symbols, which includes literal symbols and may also include strings represented as length-distance pairs. The symbol restoration block 110 reconstructs the original data by recovering the strings based on the length-distance pairs, and inserting the decoded literal symbols and recovered strings into the output stream of literal symbols in the appropriate order.

The symbols decoded by the symbol decoder 102 are output to a demultiplexer 111 in the symbol restoration block 110. The decoded symbols received by the symbol restoration block 110 from the symbol decoder 102 may be either an 8-bit literal symbol or a string represented as a length-distance pair. The symbol restoration block 110 assigns an address in the output stream to each of the received symbols and places the symbol in either the literal first-in-first-out (FIFO) buffer 112 or the string FIFO buffer 113 to await insertion into the output stream. The demultiplexer 111 sorts the symbols, transmitting literal symbols to the literal first-in-first-out (FIFO) buffer 112 and transmitting string symbols to the string FIFO 113. The symbol restoration block 110 simply inserts the decoded literal symbols into the symbol output stream 116 at their respective assigned addresses.

Strings are sequences of literal symbols represented as length-distance pairs. The symbol restoration block 110 expands these length-distance pairs back to the original sequence of literal symbols before merging this original sequence into the symbol output stream 116. The process of string restoration takes place after the entire input block has been decoded. Alternatively, string restoration may occur before the entire block has been decoded.

The length-distance pairs are used to represent strings of literal symbols that have been repeated at some point in the sequence of decoded literal symbols. For example, as part of the Zlib compression algorithm, duplicate strings identified in the original data are replaced with a length-distance pair. The distance parameter specifies the starting point of the reference string in the history buffer 114. The distance parameter indicates the starting point of the string as an offset into the decompressed data stream relative to the current position, or the most recently decoded symbol. The distance parameter may be a value indicating between 1 and 32,768 literals. The length parameter specifies the number of literal symbols to replicate from the history buffer 114, and has a value between 3 and 258 literals.

The literal FIFO 112 and the string FIFO 113 are both connected to the history buffer. Arbitration logic 117 ensures that the literal symbols from the literal FIFO 112 and the strings from string FIFO 113 are transferred to history buffer 114 in the correct order. The literal symbols and string symbols are stored in the FIFOs 112 and 113 along with metadata indicating their positions in the final output stream.

In response to receiving a length-distance pair from the string FIFO 113, the read interface 115 accesses the literal symbols stored in the history buffer 114 in order to identify and retrieve the string of literal symbols to be copied. The recovered string replaces the corresponding length-distance pair in the string FIFO 113, and is transmitted to the history buffer 114 subject to the arbitration process performed by arbitration logic 117 to maintain the original order of the literal symbols and recovered strings of literal symbols. The history buffer 114 thus stores the recovered strings of literal symbols in the correct order with the literal symbols received from literal FIFO 112.

The symbol decoder 102 continues to decode literal and string symbols in parallel with the restoration process for a previously decoded string. For example, the symbol decoder 102 decodes a first length-distance pair that is transmitted to the string FIFO 113. While the string of symbols is being restored based on the first length-distance pair, the symbol decoder 102 continues to decode more literal symbols, which are queued in the literal FIFO 112, and length-distance pairs, which are queued in the string FIFO 113. In one embodiment, the literal symbols may be inserted into the history buffer after the string for the first length-distance pair has been restored; alternatively, the literal symbols may be inserted prior to the restoration of the string, based on their assigned addresses.

The decompression process is complete after all of the length-distance pairs have been replaced with their corresponding recovered strings. The resulting data stream represents the original uncompressed data. The read interface 115 reads the uncompressed data from the history buffer 114 and transmits the uncompressed data to a symbol output 116, which may represent an output file or bitstream, for example. An Adler-32 checksum is created over the uncompressed data stream and compared against the checksum in the header.

Figure 2:
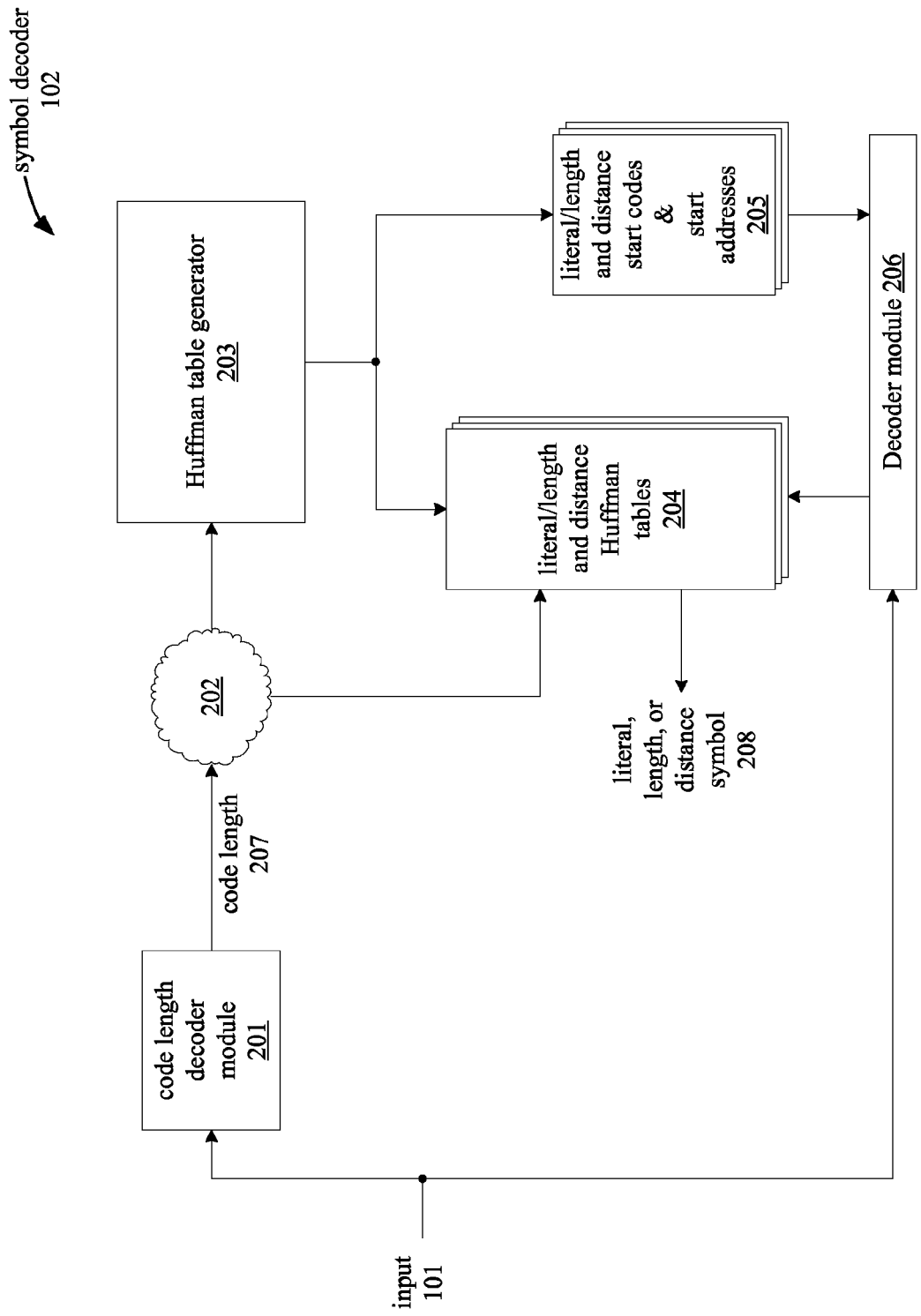
FIG. 2 illustrates symbol decoder of a decompression engine, according to one embodiment.

FIG. 2 illustrates a symbol decoder 102, according to an embodiment. As shown in FIG. 2, the symbol decoder 102 includes a code length decoder module 201 connected via combinatorial logic 202 to a Huffman table generator 203, memory storing the literal/length and distance tables 204, memory storing the start codes and start addresses 205 for each of a number of code groups, and a decoder module 206.

The code length decoder module 201 and decoder module 206 receive a sequence of bits from input 101. The sequence of bits are bits from a dynamic Huffman encoded Deflate compressed block, as previously described. The code length decoder module 201 receives HCLEN+4 code lengths each including 3 bits segments corresponding respectively to the code length symbols 16, 17, 18, 0, 8, 7, 9, 6, 10, 5, 11, 4, 12, 3, 13, 2, 14, 1, and 15 in the code length alphabet. The code length decoder module 201 generates a table for decoding code length symbols based on these received 3-bit code lengths.

The code length decoder module 201 decodes the code lengths for the literal/length alphabet and the distance alphabet. Accordingly, the code length decoder module 201 outputs a corresponding decoded code length 207 in response to receiving, at input 101, one of the HLIT+257 encoded code lengths (encoded using the code length alphabet) for a literal/length symbol, or in response to receiving one of the HDIST+1 encoded code lengths (also encoded using the code length alphabet) for a distance symbol.

The combinatorial logic 202 converts the code length 207 into signals to be used by the Huffman table generator 203 to reconstruct the literal/length and distance Huffman tables 204, and the group starting codes and group starting addresses 205 that will be used to decode the Deflate block. Decoder module 206 accesses the Huffman tables 204 and the starting codes and addresses 205 in order to decode input codes from the input 101 into the original decoded symbols.

Figure 3A:
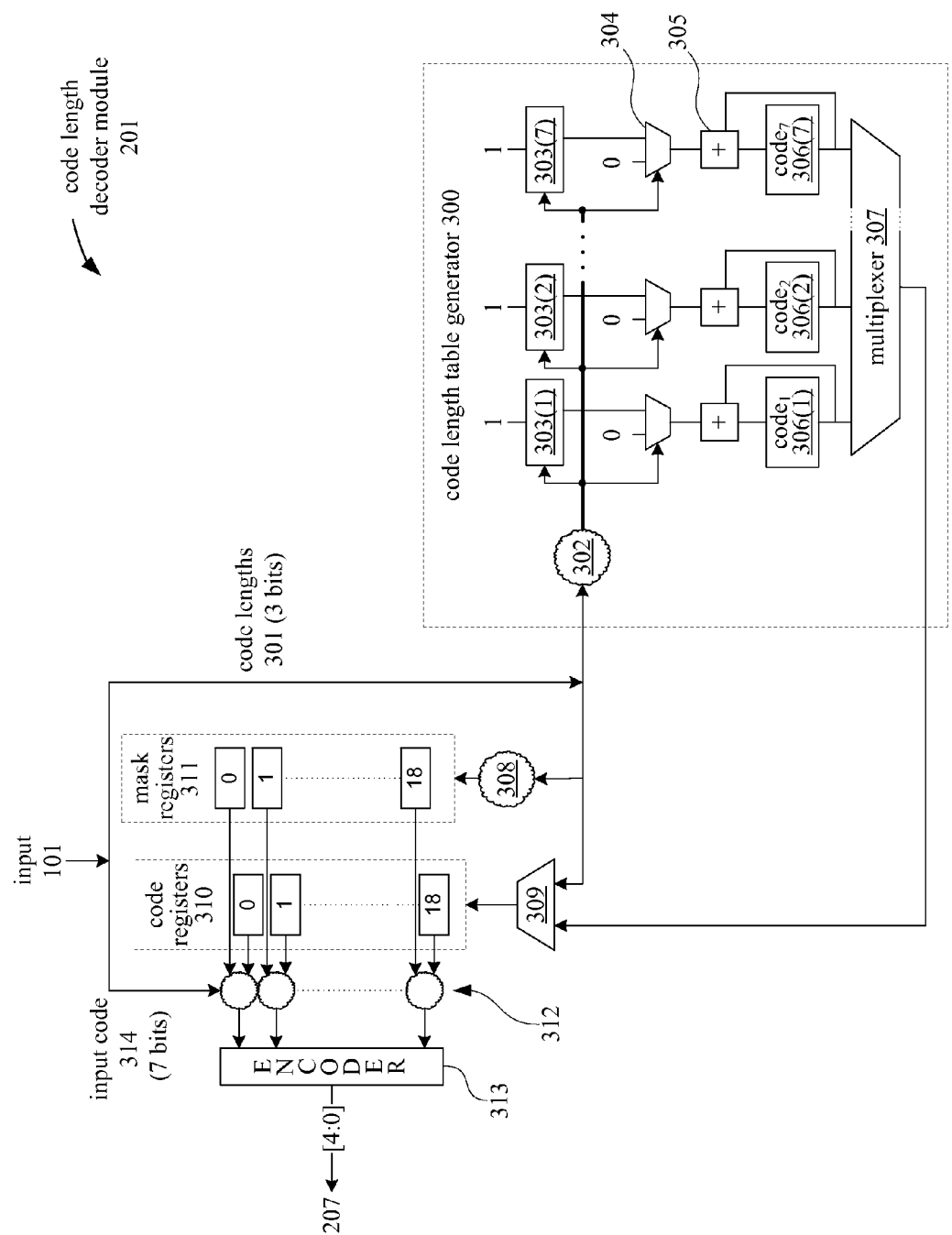
FIG. 3A illustrates an embodiment of a code length decoder module.

FIG. 3A illustrates a code length decoder module 201, according to an embodiment. The code length decoder module 201 includes a code length table generator 300, which receives the HCLEN+4 code lengths 301 for the code length alphabet via input 101. Each of the 3-bit code lengths 301 is received at combinatorial logic 302 and used to control the operation of the barrel shifters 303(1)-303(7) and the multiplexers, such as multiplexer 304.

FIG. 3B is a table illustrating the process of generating the decoding table for the code length alphabet, according to an embodiment. Each of the code registers 306(1)-306(7) correspond to one of the bit lengths 1-7, respectively, and are initialized to the corresponding number of zeros. For example, code register 306(1) stores one bit and is initialized to '0', code register 306(2) stores two bits and is initialized to '00', and so on.

The combinatorial logic 302 receives a 3-bit code length i and controls barrel shifters 303(1)-303(7) such that each of the barrel shifters corresponding to a j-bit code group, where the ordinal number j is higher than the received code length i, is incremented. For a given barrel shifter that is to be incremented, the output of the barrel shifter is a binary '1' shifted by (j−i) places, or $2^{(j-i)}$.

For example, the 3-bit code lengths 301 are received for symbols in the code length alphabet in the predetermined order 16, 17, 18, 0, 8, 7, 9, 6, 10, 5, 11, 4, 12, 3, 13, 2, 14, 1, and 15; thus, the first 3-bit code length received corresponds to the code length symbol '16'. This 3-bit code length is '110', indicating that the Huffman code for symbol '16' has a length of 6 bits. Accordingly, the combinatorial logic 302 causes the barrel shifters corresponding to bit lengths higher than 6 to be incremented by $2^{(j-6)}$. Thus, barrel shifter 303(7), corresponding to bit length 7, outputs the bits '0000010'.

Each of the barrel shifters 303(1)-303(7) has its output connected to an input of a multiplexer; for example, barrel shifter 303(7) has its output connected to one of two inputs of multiplexer 304. The other input of multiplexer 304 is connected to a '0' bit. For each multiplexer that is connected to barrel shifters having a higher ordinal number j than the received code, the combinatorial logic 302 causes the corresponding multiplexer to select the barrel shifter input instead of the '0' bit. Multiplexers connected to barrel shifters having an ordinal value less than or equal to the received code will select the '0' input.

Thus, for the higher-numbered code registers, the barrel shifter output is used to increment the value of the corresponding code register. For example, the output '0000010' from barrel shifter 303(7) is selected at the multiplexer 304 and added to the existing value '0000000' stored in the code register 306(7). The resulting incremented value of '0000010' is stored back into the code register 306(7). For code registers that are equal or less than the received code, the '0' bit is selected at the multiplexer so that the value in the code register is not incremented.

This process repeats for each of the 3-bit code lengths received by the code length table generator 300. With reference to the table in FIG. 3B, the values stored in the code registers 306(1)-306(7) change as shown as each 3-bit code length is processed in order from the top of the table to the bottom.

The final values stored in the code registers 306(1)-306(7) after all of the 3-bit code lengths have been processed represent the starting codes for each of a number of code length groups. Each code length group includes all of the Huffman codes having the same length; for example, a code length group corresponding to a code length of 6 includes the codes for '16' and '1', which both have 6 bit code lengths. The 1-bit, 2-bit, 3-bit, 4-bit, 5-bit, 6-bit, and 7-bit code groups have final starting codes of 0, 00, 110, 1100, 1110, 111110, and 0000000. The count ('Cnt') columns in the table of FIG. 3B indicate the number of codes in each group.

The 3-bit code lengths 301 are stored in the code registers 310 via multiplexer 309. Each of the registers in the code registers 310 corresponds to one of the 19 code length symbols in the code length alphabet. Each of the 3-bit code lengths 301 is thus stored in the code register for its corresponding code length symbol at the same time that the code length table generator 300 receives and processes the 3-bit code lengths 301.

After the HCLEN+4 code lengths 301 have been processed and the final starting codes in registers 306(1)-306(7) determined, the code length decoder module 201 may populate the length code decoding table stored in code registers 310. Before the registers 310 are populated, each of the registers 310 contains the 3-bit code length for the code length symbol associated with the register. The 3-bit code length identifies the code group corresponding to the code length symbol. Thus, for each of the registers 310, the starting code for the code group corresponding to the symbol associated with the register is retrieved from the appropriate code register 306 in the code length table generator 300. The retrieved starting code is then stored in the register 310, overwriting the 3-bit code length.

For example, the register corresponding to the code length symbol '0' would initially store the 3-bit code length value '010', indicating that the code length symbol '0' has a code length of 2. Accordingly, the starting code for Code Group 2 (for 2-bit codes) is retrieved from the register 306(2) for Code Group 2. This starting code is stored in the register for code length symbol '0'. The value in the register 306(2) is then incremented by 1 so that the next code length symbol having a code length of 2 receives the incremented code. This process is repeated until all 19 of the symbols are associated with a code in registers 310.

The mask registers 311 also include a register for each of the 19 code length symbols in the code length alphabet. The combinatorial logic 308 receives the code lengths 301 and generates a corresponding bit mask for each of the code length symbols. For a code length 301 of i, the bit mask includes i '1' bits, thus allowing i leading bits from the input 101 to be compared. For example, a code length 301 of '5' causes a bit mask of '0011111' to be generated. The generated bit masks are stored in the mask register 311 while the code length table generator 300 receives and processes the 3-bit code lengths 301.

Once each of the symbols in the code length alphabet is associated with both a code (stored in the code registers 310) and a bit mask (stored in the mask registers 311), the comparison logic 312 performs a comparison to determine whether the input code 314, which has a maximum size of 7-bits, matches the code. The bit mask for a symbol indicates the number of bits of the input code 314 to be compared. For example, since the symbol '0' has a code length of 2, the bit mask for the symbol '0' indicates that only the 2 leading bits of the input code 314 are to be compared with the code for symbol '0'.

The comparison logic 312 performs the comparisons for all of the symbols in parallel. Since only one code (corresponding to one symbol) matches the input code, the outputs of the comparison logic 312 are '0' except for one '1' that indicates the matching code. An encoder 313 then encodes the comparison outputs into a 5-bit representation of the code length 207 corresponding to the input code 314. The code length 207 further indicates the number of bits of the input bitstream that are consumed.

The code length decoder module 201 thus generates a decoding table based on the (HCLEN+4) 3-bit codes, and subsequently uses the decoding table to decode the HLIT+257 code lengths for generating the literal/length Huffman table and the HDIST+1 code lengths for generating the distance Huffman table.

Figure 4A:
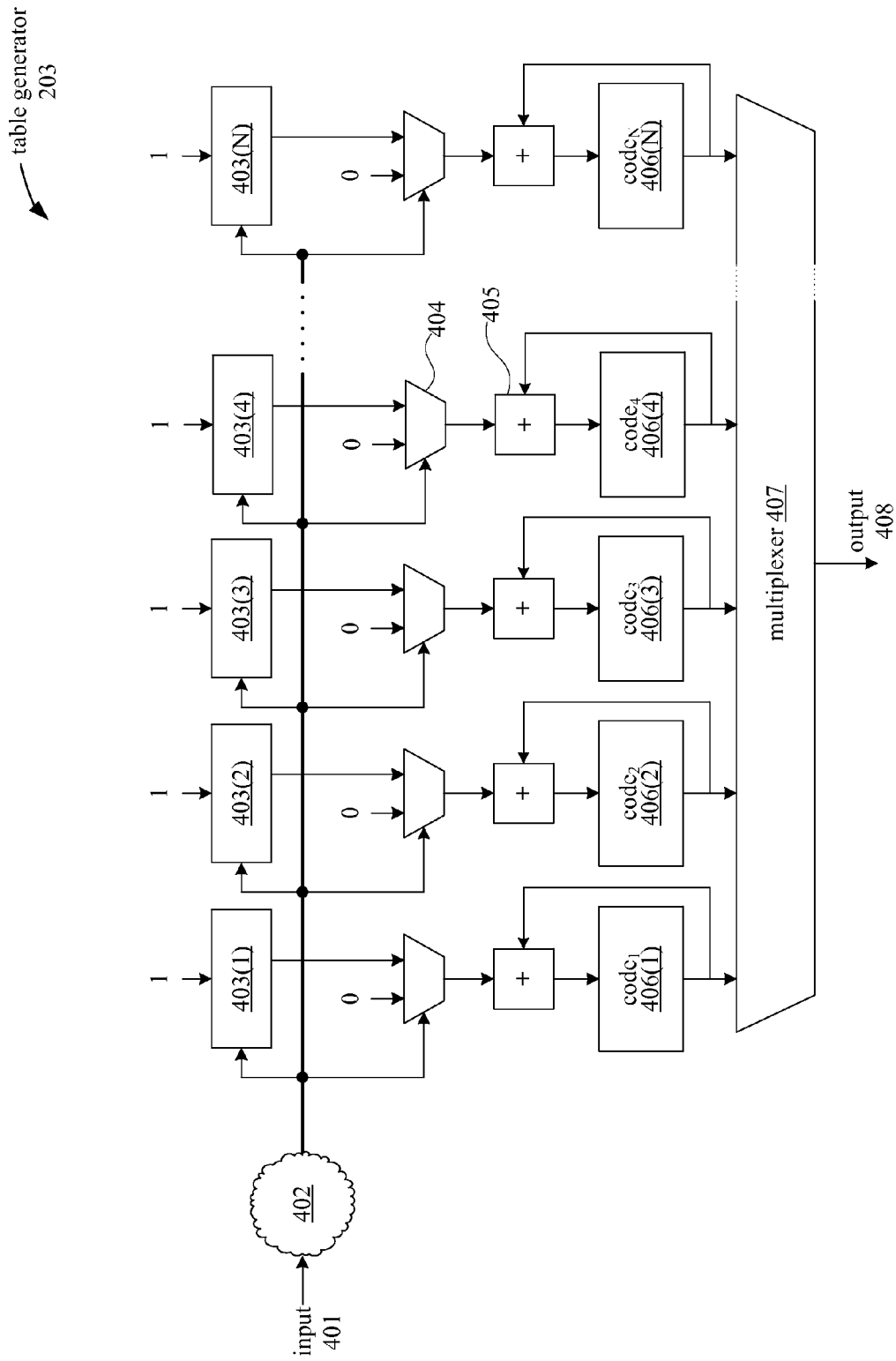
FIG. 4A illustrates an embodiment of a table generator.

FIG. 4A illustrates a table generator 203 for generating decoding tables, such as the decoding tables 204 and 205, according to an embodiment. The table generator 203 functions similarly as the code length table generator 300 illustrated in FIG. 3A. The table generator 203 is coupled to an input 401 from which it receives a set of input codes representing code lengths that have been decoded by the code length decoder module 201. The table generator generates a Huffman code table and a starting code/pointer table based on these received input codes. Each of the input codes may be one of the 5-bit code lengths 207, or may be deterministically generated based on one of the code lengths 207 by the combinatorial logic 202 illustrated in FIG. 2.

The table generator 203 has its own combinatorial logic 402 that converts the received input code to signals that are used to control the operation of barrel shifters 403(1)-403(N) and the multiplexers to which the barrel shifters 403(1)-403(N) are connected, such as multiplexer 404. The barrel shifters 403, multiplexers, and adders, such as adder 405, function together to update a set of starting codes stored in the code registers 406 in response to input code lengths received at input 401.

FIG. 4B includes a table illustrating the contents of the code registers 406(1)-406(4) as symbol-length pairs are processed. In one embodiment, additional higher-numbered code registers may be present; however, they are not represented in FIG. 4B for the sake of clarity. As illustrated in FIG. 4B, the symbol-length pairs are added in sequence from the top row of the table to the bottom row, starting with the literal symbol 'A'. The symbol itself is not transmitted to the table generator but is implicit based on a predetermined lexical order of the symbols. For example, the nth code length received at the input 401 corresponds to the nth symbol in the lexical order.

For each of the code lengths received from input 401, the inputs of barrel shifters 403(1)-403(N) are controlled by the logic 402 so that barrel shifters corresponding to a j-bit code group, where the ordinal number j is higher than the received code length i, is incremented. For a given barrel shifter that is to be incremented, the output of the barrel shifter is a binary '1' shifted by (j−i) places, or $2^{(j-i)}$.

For example, the first code length received is '3', indicating that the literal symbol 'A' is represented by a 3-bit code. Accordingly, the combinatorial logic 402 causes the barrel shifters corresponding to bit lengths greater than 3 to be incremented by $2^{(j-3)}$. Thus, barrel shifter 403(4), corresponding to bit length 4, outputs the bits '0010'. As an additional example, when the code length '2' for symbol 'F' is received, the barrel shifter 403(3) outputs the bits '010' and the barrel shifter 403(4) outputs the bits '0100'.

Each of the barrel shifters 403(1)-403(N) has its output connected to an input of a multiplexer; for example, barrel shifter 403(1) has its output connected to one of two inputs of multiplexer 404. The other input of multiplexer 404 is connected to a '0' bit. For each multiplexer that is connected to barrel shifters having a higher ordinal number j than the received code length i, the combinatorial logic 402 causes the corresponding multiplexer to select the barrel shifter input instead of the '0' bit. Multiplexers connected to barrel shifters having an ordinal value less than or equal to the received code will select the '0' input.

Thus, for each of the code registers 406 having a higher ordinal number j than the received code length i, the barrel shifter output is used to increment the value of the corresponding code register. For example, when the code length '2' is received corresponding to the symbol 'F', the output '0100' from barrel shifter 403(4) is selected at the multiplexer 404 and added via adder 405 to the existing value '1010' stored in the code register 406(4). The resulting incremented value of '1110' is stored back into the code register 406(4). For code registers that are equal or less than the received code, the combinatorial logic 402 causes the '0' bit to be selected at the multiplexer so that the value in the code register is not incremented.

The table generator 203 also updates a set of starting addresses, which are stored in memory 205 illustrated in FIG. 2, during the processing of the received code lengths. Each starting address is associated with one of the code groups. When a code length i is received, each starting address for a code group having a bit length j that is greater than i is incremented. With reference to FIG. 4B, for example, when code length '2' is received corresponding to symbol 'F', each starting address associated with a code group having j>2 is incremented. Thus, the starting codes for Group 3 and Group 4 are incremented from 0 to 1 and from 5 to 6, respectively.

FIG. 4C illustrates a Huffman code table 412 (which exemplifies one of the tables 204) and a start code and pointer table 413 (which exemplifies one of the tables 205). The Huffman code table 412 is generated by an insertion sort process as the code lengths for each literal symbol are received. The literal symbols are sorted primarily by their code lengths, then by their lexical orders. In other words, every symbol having a shorter code length is stored at a lower address in the table 412 than any symbol having a longer code length; in addition, symbols having the same code length are sorted lexically with respect to each other. For example, 'A' has a code length of 3 and is accordingly stored at a higher address than 'F' having a code length of 2, and is stored at a lower address than the 'G' and 'H' symbols having a code length of 4. Symbols A-E have the same code lengths of 3 and are sorted in lexical order relative to each other.

This process of updating the starting codes, starting addresses, and the Huffman code table 412 repeats for each of the code lengths that the table generator 203 receives. With reference to the table in FIG. 4B, the values stored in the code registers 406(1)-406(4) change as shown as each code length is processed in order from the top of the table to the bottom.

The final values stored in the code registers 406(1)-406(4) after all of the code lengths have been processed represent the starting codes for each of the code groups. As illustrated in FIG. 4B, the code groups Group 1, Group 2, Group 3, and Group 4 include codes having lengths of 1-bit, 2-bits, 3-bits, and 4-bits. These code groups have final starting codes of '0', '00', '010', and '1110', respectively. The code groups have final starting addresses of 0, 0, 1, and 6. When all of the code lengths have been processed, the final starting codes and starting addresses are stored in the table 413. The starting addresses are stored as pointers.

Figure 5:
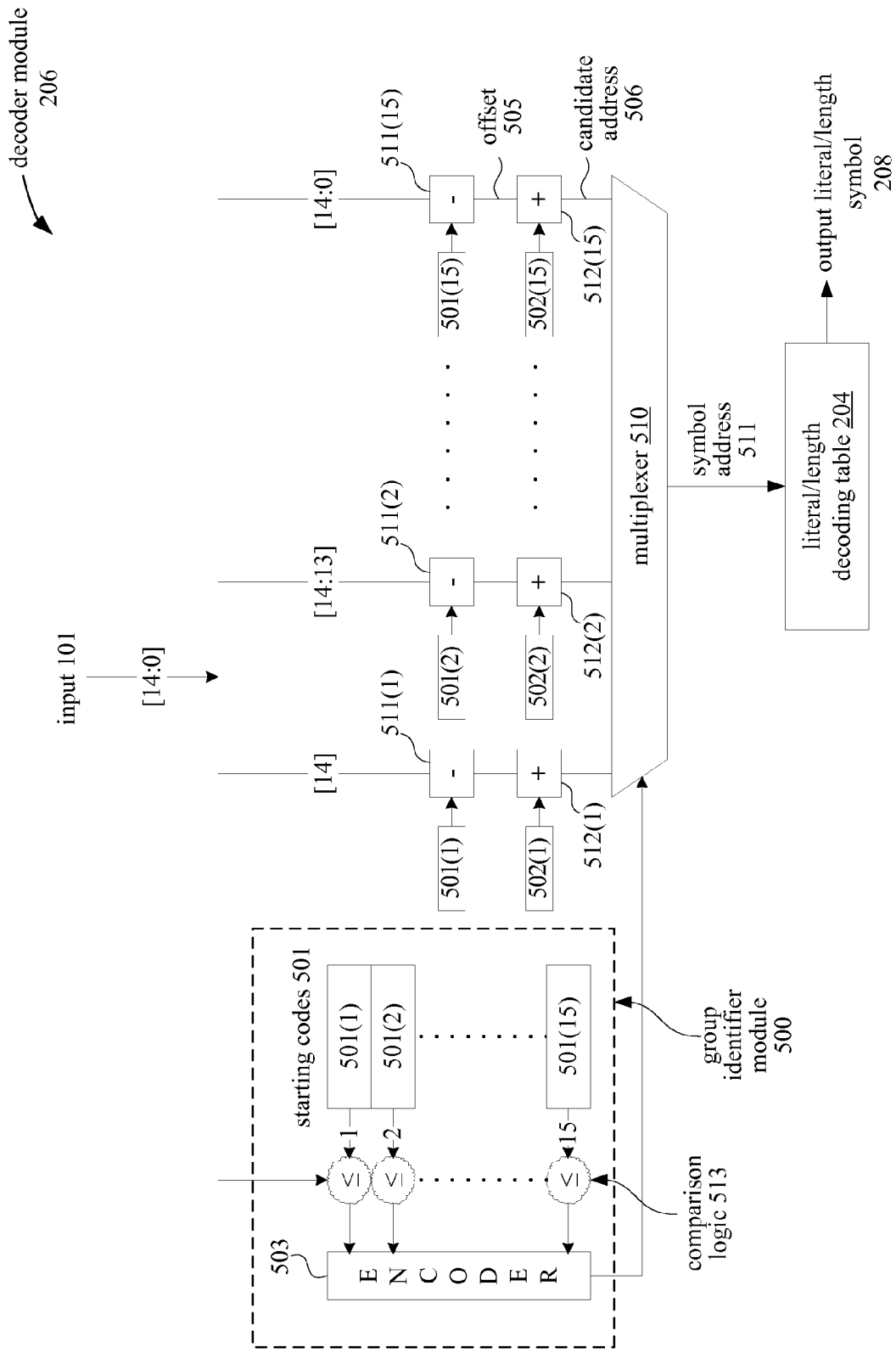
FIG. 5 illustrates an embodiment of a decoder module.

FIG. 5 illustrates an embodiment of a decoder module 206 that utilizes the final starting codes and final starting addresses to decode a sequence of input codes representing the payload data of the block. The decoder module 206 receives an input code from input 101. The decoder module 206 may process up to as many bits from the input bitstream as the maximum length input code. For example, if the maximum length for an input code is 15 bits, the decoder module 206 may process up to 15 bits from the input bitstream at a time. The input code representing the symbol to be decoded may include fewer than all of the 15 bits.

The decoder module 206 includes a parallel branch corresponding to each code group, where each parallel branch includes a subtractor 511 and an adder 512. As illustrated in FIG. 5, the branch corresponding to Group 1 (for 1-bit codes) includes subtractor 511(1) and adder 512(1), the branch corresponding to Group 2 (for 2-bit codes) includes subtractor 511(2) and adder 512(2), and so on.

As illustrated, decoder module 206 includes 15 branches; however, alternative embodiments may include fewer or more branches to accommodate fewer or more code groups. In decoder 206, each of the branches is used to calculate a candidate address at which the decoded symbol may possibly be found in the literal/length decoding table 204. Each branch and candidate address calculated by the branch thus corresponds to one of the code groups. Each branch processes a number of bits corresponding to its associated code group. For example, the branch for Code Group 1 (for 1-bit codes) receives one bit [14], the branch for Code Group 2 (for 2-bit codes) receives two bits [14:13], the branch for Code Group 15 (for 15-bit codes) receives 15 bits [14:0], and so on.

Each of the subtractors 511 receives a sequence of these branch input bits representing a branch input value and subtracts a starting code from the branch input value. The starting code corresponds to the code group associated with the branch. For example, in the branch associated with Code Group 15, subtractor 511(15) subtracts the starting code 501 (15) for Code Group 15 from the branch input value to obtain an offset value 505. Each subtractor 511 obtains the starting code from a memory register in the table 413, illustrated in FIG. 4C.

The adders 512 for each branch add to the offset values the starting address corresponding to the code group associated with the branch in order to calculate a candidate address for the code group. For example, in the branch associated with Code Group 15, adder 512(15) generates the candidate address 506 by adding the starting address 502(15) for Code Group 15 to the offset 505. Each adder 512 obtains the starting address from a memory register in the table 413, illustrated in FIG. 4C.

A candidate address $Addr_j$ for Group j (including j-bit codes) can generally be calculated as being equal to (SymCode−$Code_j$.StartCode)+$Code_j$.StartAddr, where SymCode is the branch input value, $Code_j$.StartCode is the starting code for Group j, and $Code_j$.StartAddr is the starting address for Group j. Because the calculation of candidate addresses is performed by the branches in parallel, the decoder module 206 is capable of processing literal symbols in no more than a single clock cycle and length-distance pairs in no more than two clock cycles.

The decoder module 206 further includes a group identifier module 500, which identifies a code group based on the input code received at input 101. The group identifier module 500 includes comparison logic 513 that compares the input code with a starting code 501 for each of the code groups in parallel. The comparison logic 513 obtains the starting codes 501 from table 413.

The comparison logic 513 outputs a '1' for each of the starting codes 501 where the starting code 501 is less than or equal to the input code, and otherwise outputs a '0'. The input code belongs to the highest ordinal group whose starting code is less than or equal to the input code. For example, as illustrated in FIG. 5, the comparison logic 513 compares the input code with 15 starting codes 501(1)-505(15), resulting in a 15-bit comparison result. The comparison result identifies the code group in which the input code belongs.

Each of the candidate addresses corresponds to one of the code groups; thus, the encoder 503 uses the comparison result to select the candidate address corresponding to the identified code group via multiplexer 510. In general, if the comparison logic 513 determines that the input code belongs to Code Group j, then the multiplexer 510 selects the candidate address corresponding to Code Group j. The selected candidate address is the final symbol address 511 indicating a location in the decoding tables 204 where the decoded symbol can be found.

The output of multiplexer 510 is connected to an input of decoding tables 204. In response to receiving the final symbol address 511 from the multiplexer 510, the decoding tables 204 output the decoded symbol from a memory address matching the final symbol address. Each time a symbol is decoded, the input stream is advanced by the code length of the input code. For example, if Group j is identified as the code group containing the input code, then j bits are consumed from the input bitstream. This decoding process is repeated until the end of the block is reached.

The symbol restoration block 110, illustrated in FIG. 1, further processes the stream of decoded symbols. As previously described, the demultiplexer 111 sorts the symbols into the FIFOs 112 and 113, the strings represented as length-distance pairs are recovered from the history buffer 114, and the final stream of literal symbols and recovered strings of literal symbols are stored in the history buffer 114 in the correct sequence before being written out to symbol output 116.

The decoder module 206 of the symbol decoder 102 continues to perform the process of decoding input codes, including the calculation of candidate addresses and identifying of code groups for the input codes, at the same time that the read interface module processes a previously decoded length-distance pair by retrieving from the history buffer the string of symbols specified by the length-distance pair.

Figure 6:
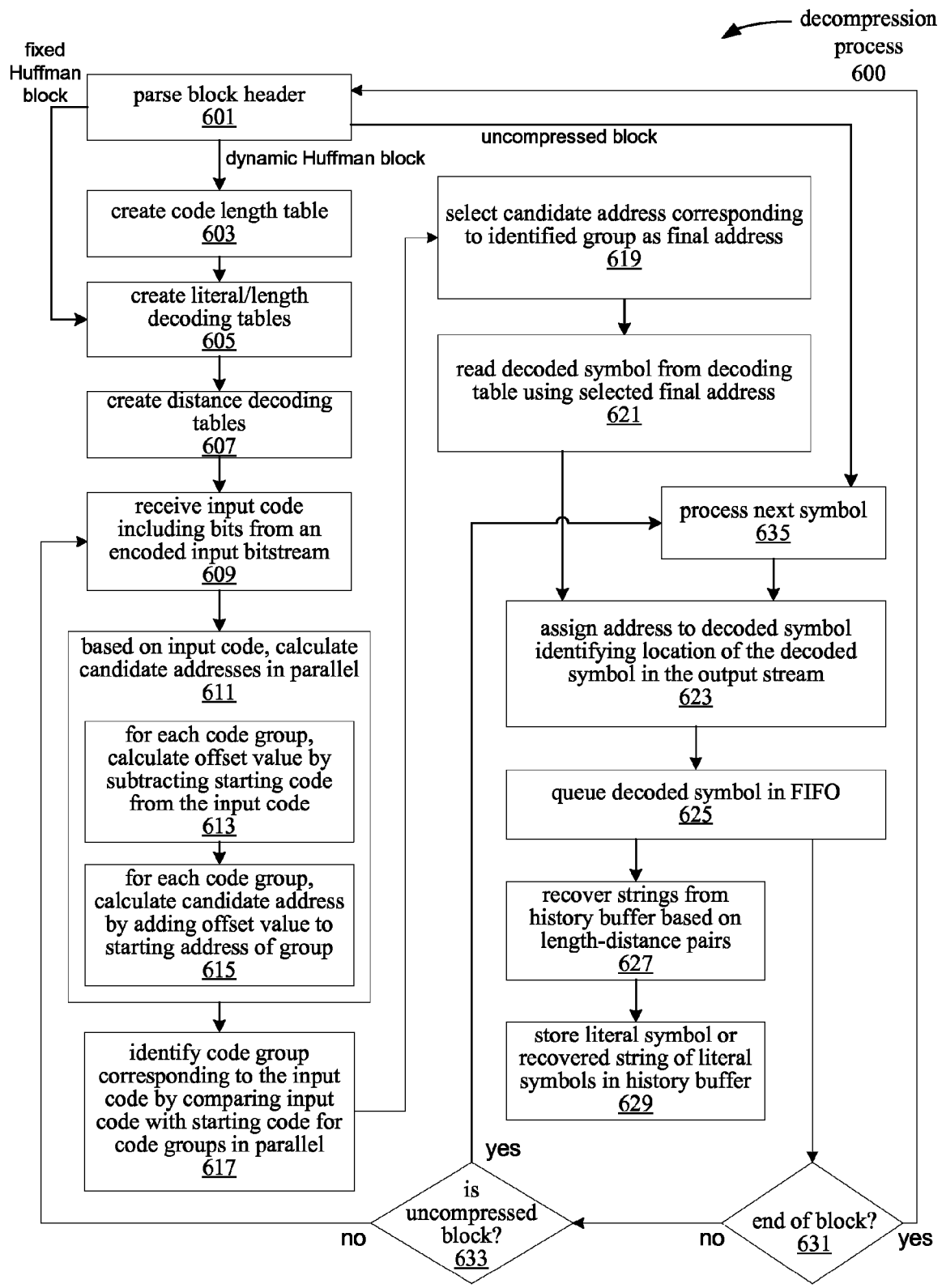
FIG. 6 is a flow diagram illustrating an embodiment of a decompression process.

FIG. 6 is a flow diagram illustrating a process 600 for decompressing a block of encoded data, according to one embodiment. A decompression engine such as decompression engine 100, illustrated in FIG. 1, performs the process 600 in order to decompress data in an uncompressed, fixed, or dynamic Huffman encoded block.

Process 600 begins at block 601. At block 601, the decompression engine parses the block header of a block of encoded data. From the header, the decompression engine determines whether the block is uncompressed, fixed Huffman encoded, or dynamic Huffman encoded. If the block is a dynamic Huffman encoded block the header also includes the fields HLIT, HDIST, HCLEN, as previously described.

For an uncompressed block, the process 600 transitions from block 601 to block 635. At block 635, the next symbol is processed. For an uncompressed block, this simply includes reading the symbol directly from the block of data. The symbol is assigned an address in the output stream at block 623, and queued at block 625 prior to output. From block 625, the process 600 continues at block 631. At block 631, if the end of the data block has been reached, the process 600 continues back to block 601 to parse the header of the next data block. Otherwise, the process 600 continues at block 633. At block 633, the process 600 for an uncompressed block continues back to block 635, where the next symbol is processed. For each uncompressed data block, the process 600 thus reads the symbols from the data block to the output stream until the end of the block is reached.

For a fixed Huffman encoded block, the process 600 transitions from block 601 to block 605. Thus, the process 600 for decoding a fixed Huffman encoded block is similar to the process 600 for decoding a dynamic Huffman block, except that the creation of the code length table 603 is skipped.

For a dynamic Huffman encoded block, the process 600 continues from block 601 to block 603. At block 603, the decompression engine 100 creates a code length table from (HCLEN+4) 3-bit codes each indicating a code length for a symbol in the code length alphabet. The code length table is created using the code length decoder module 201, which stores the code length table in code registers 310. The code length decoder module 201 then performs decoding of the (HLIT+257) length codes for the literal/length Huffman table and (HDIST+1) length codes for the distance Huffman table. From block 603, the process 600 continues at block 605.

At block 605, the decompression engine 100 creates the decoding tables for literal and length symbols. The decoding tables include a Huffman code table for storing Huffman codes for each of the literal symbols and length symbols, and also include a table of start codes and start addresses for each code group. The table generator 203 portion of the decompression engine 100 creates the decoding tables 204 and 205. From block 605, the process 600 continues at block 607.

At block 607, the decompression engine 100 creates decoding tables for an alphabet of distance symbols. These decoding tables include a Huffman code table storing a Huffman code for each symbol in the alphabet of distance symbols and also include a table for the starting codes and starting addresses for each code group containing codes for distance symbols. Table 203 or a similar table generator generates the decoding tables. From block 607, the process 600 continues at block 609.

At block 609, the decompression engine 100 receives an input code from a bitstream of encoded data. For example, the decoder module 206 of the decompression engine 100 receives the leading bits of the encoded data comprising the input code from input 101. From block 609, the process 600 continues at block 611.

At block 611, the decoder module 206 calculates in parallel, based on the received input code, a set of candidate addresses, where each candidate address corresponds to one of the code groups. Block 611 further includes the operations represented in blocks 613 and 615.

At block 613, the decoder module 206 subtracts, for each code group, a starting code from the input code to generate an offset value. Subtractor 511, as illustrated in FIG. 5, performs this subtraction operation. From block 613, the process 600 continues at block 615.

At block 615, the decoder module 206 calculates a candidate address for each of the code groups by adding the offset value generated at block 613 to a starting address corresponding to the code group. This operation is performed by adders 512, as illustrated in FIG. 5. The decoder module 206 thus calculates the candidate addresses in parallel by performing the operations of blocks 613 and 615. From block 615, the process 600 continues at block 617.

At block 617, the group identifier module 500 of the decoder module 206 identifies a code group corresponding to the input code. The decoder module 206 identifies the appropriate code group by, for each of the code groups, comparing the input code with a starting code 501 for the code group. Comparison logic 513 performs the comparison in parallel, generating a comparison result that indicates the code group in which the input code is a member. From block 617, the process 600 continues at block 619.

At block 619, the group identifier module 500 selects the candidate addresses corresponding to the identified code group as a final address 511 for the symbol being decoded. Encoder 503 converts the comparison result from logic 513 into one or more signals for causing multiplexer 510 to select the candidate address corresponding to the identified group as the final symbol address 511. From block 619, the process 600 continues at block 621.

At block 621, the decoder module 206 reads from a decoding table 204 a decoded symbol corresponding to the input code. The decoder module 206 reads the decoded symbol from a memory address of the decoding table that matches the final address selected at block 619. The decoding table 204 outputs a literal or length symbol 208 in response to receiving the final symbol address 511 selected by the multiplexer 510. If the symbol 208 is a length symbol, the decoder module processes the next input code as a distance symbol, using a distance decoding table to decode the distance symbol. The decoder module then outputs the decoded length-distance pair. From block 621, the process 600 continues at block 623.

At block 623, the symbol restoration block 110 of the decompression engine 100, as illustrated in FIG. 1, receives the decoded symbol and assign to the decoded symbol an address in the final output stream. From block 623, the process 600 continues at block 625.

At block 625, the symbol restoration block 110 queues the decoded literal symbols or length-distance pair. The demultiplexer 111 sorts the decoded symbol or length-distance pairs so that literal symbols are queued in the literal FIFO buffer 112 and length-distance pairs are queued in the string FIFO 113. From block 625, the process 600 continues at block 631.

At block 631, the decompression engine 100 determines whether the end of the block has been reached. If the end of the block has not been reached, process 600 continues back to block 609 via block 633, to process the next input code. If the end of the block has been reached, process 600 continues back to block 601, where the header of the next block is processed.

From block 625, the process 600 concurrently continues at block 627. The operations of blocks 627 and 629 are performed in parallel with the decoding operations of blocks 601-625 and 631-633. At block 627, the symbol restoration block 110 recovers the strings of symbols from history buffer 114 as specified by the length-distance pairs in the string FIFO 113. From block 627, the process 600 continues at block 629.

At block 629, the symbol restoration block 110 stores each decoded literal symbol or recovered string of symbols in the history buffer 114 in sequence with other symbols decoded from the bitstream of encoded data. The symbol restoration block 110 outputs the literal symbols and strings to the symbol output 116 in order according to the output stream address assigned at block 623.

The embodiments described herein may include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the decompression engine 100 and/or portions thereof carried on the computer-readable storage medium may be a database or other data structure which can be read by a program and used, directly or indirectly, to fabricate the hardware comprising the decompression engine 100. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the decompression engine 100. The netlist may then be placed and routed to produce a data set describing geometric shapes to be applied to masks. The masks may then be used in various semiconductor fabrication steps to produce a semiconductor circuit or circuits corresponding to the decompression engine 100. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader spirit and scope of the embodiments as set forth in the appended claims. The specification and drawings are, accordingly, to be regarded in an illustrative sense rather than a restrictive sense.

What is claimed is:

1. An apparatus, comprising:
an input configured to receive an input code, wherein the input code comprises one or more bits from a bitstream of encoded data;
a symbol decoder coupled with the input, wherein the symbol decoder is configured to calculate, based on the input code, a plurality of candidate addresses, wherein each of the plurality of candidate addresses corresponds to one of a plurality of code groups, and wherein the symbol decoder comprises:
a group identifier module coupled with the symbol decoder, wherein the group identifier module is configured to identify one of the plurality of code groups corresponding to the input code; and
a multiplexer coupled with the group identifier module, wherein the multiplexer is configured to select as a final address one of the plurality of candidate addresses corresponding to the identified code group.

2. The apparatus of claim 1, wherein the symbol decoder further comprises, for each code group of the plurality of code groups:
a subtractor coupled with the input, wherein the subtractor is configured to subtract a starting code from the input code to generate an offset value; and
an adder coupled with the subtractor, wherein the adder is configured to calculate one of the plurality of candidate addresses by adding the offset value to a starting address corresponding to the code group.

3. The apparatus of claim 2, further comprising, for each code group of the plurality of code groups:
a first register coupled with the subtractor, wherein the first register is configured to store a starting code for the code group; and
a second register coupled with the adder, wherein the second register is configured to store a starting address for the code group.

4. The apparatus of claim 1, wherein the symbol decoder is configured to calculate the candidate addresses in parallel.

5. The apparatus of claim 1, wherein the group identifier module comprises comparison logic configured to compare, in parallel, the input code with a starting code for each of the plurality of code groups.

6. The apparatus of claim 1, further comprising a decoding table coupled with the multiplexer, wherein the decoding table is configured to, in response to receiving the final address, output a symbol corresponding to the input code from a memory address matching the final address.

7. The apparatus of claim 6, further comprising a history buffer coupled with the symbol decoder, wherein the history buffer is configured to store the symbol in sequence with other symbols decoded by the symbol decoder from the bitstream of encoded data.

8. A method, comprising:
receiving an input code comprising one or more bits from a bitstream of encoded data;
based on the input code, calculating in parallel a plurality of candidate addresses each corresponding to one of a plurality of code groups;
identifying one of the plurality of code groups corresponding to the input code by comparing the input code with a starting code for each of the plurality of code groups;
selecting as a final address one of the plurality of candidate addresses corresponding to the identified code group.

9. The method of claim 8, further comprising, for each code group of the plurality of code groups:
subtracting a starting code from the input code to generate an offset value; and
calculating one of the plurality of candidate addresses by adding the offset value to a starting address corresponding to the code group.

10. The method of claim 9, further comprising, for each code group of the plurality of code groups:
storing a starting code for the code group; and
storing a starting address for the code group.

11. The method of claim 8, wherein the comparing the input code with the starting code for each of the plurality of code groups is performed in parallel.

12. The method of claim 8, further comprising reading from a decoding table a symbol corresponding to the input code from a memory address of the decoding table matching the final address.

13. The method of claim 12, further comprising storing the symbol in a history buffer in sequence with other symbols decoded from the bitstream of encoded data.

14. A system, comprising:
an input configured to receive a sequence of bits;
a table generator coupled with the input, wherein the table generator is configured to generate a decoding table based on a first set of input codes in the sequence of bits; and
a symbol decoder coupled with the input, wherein the symbol decoder is configured to calculate, based on a second set of input codes in the sequence of bits, a plurality of candidate addresses, wherein each of the plurality of candidate addresses corresponds to one of a plurality of code groups, and wherein the symbol decoder comprises:
a group identifier module coupled with the symbol decoder, wherein the group identifier module is configured to identify one of the plurality of code groups corresponding to the input code; and
a multiplexer coupled with the group identifier module, wherein the multiplexer is configured to select as a final address one of the plurality of candidate addresses corresponding to the identified code group.

15. The system of claim 14, further comprising a memory configured to store the decoding table, wherein the memory is further configured to output from the decoding table a symbol corresponding to the final address in response to receiving the final address from the multiplexer.

16. The system of claim 14, wherein the symbol decoder is configured to calculate the candidate addresses in parallel, and wherein the symbol decoder further comprises, for each code group of the plurality of code groups:
- a subtractor coupled with the input, wherein the subtractor is configured to subtract a starting code from the input code to generate an offset value;
- a first register coupled with the subtractor, wherein the first register is configured to store the starting code for the code group;
- an adder coupled with the subtractor, wherein the adder is configured to calculate one of the plurality of candidate addresses by adding the offset value to a starting address corresponding to the code group; and
- a second register coupled with the adder, wherein the second register is configured to store the starting address for the code group.

17. The system of claim 14, wherein the group identifier module comprises comparison logic configured to compare the input code with a starting code in parallel for each of the plurality of code groups.

18. The system of claim 14, further comprising a demultiplexer coupled with the symbol decoder, wherein the demultiplexer is configured to transmit a symbol from the symbol decoder to a literal buffer if the symbol is a literal symbol, and to transmit the symbol to a string buffer if the symbol represents a length-distance pair.

19. The system of claim 18, further comprising a read interface module coupled with the string buffer, wherein the read interface module is configured to retrieve a string from the history buffer based on a length-distance pair, and wherein the symbol decoder is further configured to calculate the plurality of candidate addresses while the read interface module retrieves the string from the history buffer.

20. The system of claim 19, wherein the length-distance pair is decoded by the decoding module prior to the decoding of each of a plurality of literal symbols, and wherein the literal buffer comprises a first-in-first-out (FIFO) buffer configured to store the plurality of literal symbols and output the plurality of literal symbols after the read interface module has retrieved the string.

* * * * *